(12) United States Patent
Hauf et al.

(10) Patent No.: US 7,993,486 B2
(45) Date of Patent: Aug. 9, 2011

(54) TREATMENT UNIT FOR THE WET-CHEMICAL OR ELECTROLYTIC TREATMENT OF FLAT WORKPIECES

(75) Inventors: Uwe Hauf, Wendelstein (DE); Henry Kunze, Wendelstein (DE); Ferdinand Wiener, Burgthann (DE)

(73) Assignee: Atotech Deutschland GmbH, Berlin (DE)

( * ) Notice: Subject to any disclaimer, the term of this patent is extended or adjusted under 35 U.S.C. 154(b) by 297 days.

(21) Appl. No.: 10/581,353

(22) PCT Filed: Dec. 7, 2004

(86) PCT No.: PCT/EP2004/014008
§ 371 (c)(1),
(2), (4) Date: May 31, 2006

(87) PCT Pub. No.: WO2005/059206
PCT Pub. Date: Jun. 30, 2005

(65) Prior Publication Data
US 2007/0012560 A1    Jan. 18, 2007

(30) Foreign Application Priority Data

Dec. 19, 2003 (DE) .................................. 103 61 880

(51) Int. Cl.
*C23C 16/00* (2006.01)
*C25D 17/28* (2006.01)
(52) U.S. Cl. ...................... 156/345.2; 204/198; 205/145; 414/935; 414/941

(58) Field of Classification Search .................. 204/198, 204/202, 298.24; 156/345.2; 205/145, 151; 414/935, 941
See application file for complete search history.

(56) References Cited

U.S. PATENT DOCUMENTS

| 4,607,590 A | 8/1986 | Pender et al. |
| 5,592,958 A | 1/1997 | Gardner et al. |
| 5,755,935 A | 5/1998 | Jackson et al. |

FOREIGN PATENT DOCUMENTS

| DE | 32 36 545 A1 | 5/1983 |
| DE | 40 35 932 A1 | 5/1992 |
| DE | 102 10 538 A1 | 9/2003 |
| EP | 0 959 153 A | 11/1999 |
| JP | A-HEI-03-28395 | 2/1991 |

*Primary Examiner* — Sylvia R. MacArthur
(74) *Attorney, Agent, or Firm* — Paul & Paul (57) ABSTRACT

The present invention relates to treatment units for the wet-chemical or electrolytic treatment of flat workpieces (1), such as metal foils, printed circuit foils or printed circuit boards, in which the workpieces (1) are transported on a conveying path by means of conveying members (6, 6', 6", 7). The treatment unit comprises carrier elements (4) with recesses (21), said carrier elements (4) being oriented to be parallel to the conveying path, and at least one module system for carrying the conveying members (6, 6', 6", 7) that consist of insertion elements (14, 26), preferably arranged in pairs, the at least one module system being configured such that it registers with and is preferably slidable into the recesses (21) of the carrier elements (4). The treatment unit is preferably utilized in horizontal conveyorized lines.

23 Claims, 5 Drawing Sheets

TREATMENT UNIT FOR THE WET-CHEMICAL OR ELECTROLYTIC TREATMENT OF FLAT WORKPIECES

The present invention relates to a treatment unit for the wet-chemical or electrolytic treatment of flat workpieces, for example of metal foils, printed circuit foils or printed circuit boards, and to the use of the treatment unit for treating the flat workpieces in conveyorized lines, preferably in horizontal lines.

Various forms of lines for the wet-chemical or electrolytic treatment are known. In principle, they include treatment units in which the workpieces are for example rinsed, dried or chemically or electrolytically treated, and conveyor systems for transporting the workpieces on a conveying path through the treatment units. These conveyor systems generally consist of conveying members that are disposed across the conveying path, with the conveying members being disposed either on both sides or on only one side of the conveying path. In principle, the conveying members hereby comprise an axle traversing the conveying member, said axle including a region serving for transporting the workpieces. Depending on the workpieces to be transported and to the type of treatment, the conveying members may comprise different regions, for example cylindrical regions or regions on which there are provided conveyor wheels.

In most cases, the conveying members are carried on either side at their axles within the treatment unit, a treatment tank for example, on carrier walls that are oriented to be parallel to the conveying path. Said carrier walls are made to the individual specifications of each conveyor system and are fitted into the treatment unit.

The carrier walls may comprise a plurality of openings. Bores into which the axle bearings of the conveying members may be introduced may for example be provided beneath the conveying path. If, as described herein above, conveying members are needed on either side of the conveying path, for example above and beneath a horizontal conveying path, for better guidance of the workpieces, the openings in the carrier walls must be made accordingly wider, e.g., by milling U-shaped holes for receiving the axles of the upper conveying members:

Two-sided guidance of the workpieces is for example appropriate where treatment fluids are exerting a pressure onto the workpieces from beneath. In order to permit transport of workpieces of different thicknesses, the bearings of the upper and lower conveying members are formed into different shapes when guidance is provided on two sides. The lower bearing has a circular bearing hole and the upper bearing is generally formed into a U-shaped slot that extends normal to the direction of the conveying path. The advantage thereof is that the upper conveying members are free to move within the slots, thus being capable of accommodating to the different thicknesses of the workpieces. Thick workpieces thereby cause the conveying members to be pushed upward so that they are capable of passing through the gap between the upper and the lower conveying members.

The treatment fluid is often fed into the process by means of nozzles that are arranged above and/or beneath the conveying path. This and other apparatus, such as ultrasonic transducers, blowing devices, anodes and the like, are also secured to the carrier walls that are configured for the specific purpose of carrying said apparatus, the distance and shape of the conveying members and the position of the apparatus used having to be matched.

DE 32 36 545 A1 discloses a device for electroplating flat workpieces with the workpieces being conveyed horizontally through an electrolyte bath. The device inter alia comprises side walls that are disposed along a horizontal flow path of the workpieces. Electrode devices, treatment devices, such as nozzles, conveyor systems or supply systems for the treatment devices are secured in said side walls.

DE 102 10 538 A1 discloses a horizontal conveyorized line comprising a treatment liquid containing treatment tank. A printed circuit board is transported through this container. A flow nozzle is carried by an upper supporting frame, the relative vertical position of which is adjusted by an actuating drive. In the upper supporting frame long holes are provided to carry upper conveyor rolls. Lower conveyor rolls are carried by a lower carrier the bearing for the lower rolls being holes therein. The conveyor rolls serve to transport the printed circuit board in the treatment tank.

The drawback of lines of the type described herein above is that the carrier walls have to be constructed and made to the individual specification of each treatment unit. In lines of the type described herein above, it is for example not possible to interchange different types of conveying members in one and the same line or to adapt the arrangement of the other treatment devices so that it is suited to serve a new purpose.

Another disadvantage is that the expense associated with maintenance and cleaning of such type lines is very high since the treatment unit has in most cases to be largely disassembled for this purpose, which, beside the expense associated with personnel, material and energy, also involves quite long and, as a result thereof, expensive downtimes of the line.

Thus, the object of the present invention is to avoid the disadvantages of the known wet-chemical or electrolytic processing lines and more specifically to provide a treatment unit having a flexible and simple structure. More specifically the object of the present invention is to reducing the great number of different component parts used in such type lines as well as the construction and assembly expense associated therewith so as to reduce the costs of producing and assembling the parts of such lines as well as those associated with maintenance and remodeling of the line. Concurrently, the object aims at considerably reducing the cost and expense involved in maintenance and cleaning as well as in loss of production.

This object is solved by the treatment unit according to claim 1 and by the use of the treatment unit according to claim 22. Preferred embodiments of the invention are recited in the subordinate claims.

The treatment unit of the invention more specifically serves to wet-chemically or electrolytically treat flat workpieces, preferably printed circuit boards or foils. The workpieces are hereby transported through the treatment unit, such as a treatment tank, by means of conveying members that extend preferably normal to the direction of transport of the workpieces, in which direction the conveying path extends. The treatment unit comprises carrier elements that are oriented parallel to the conveying path and have recesses as well as at least one module system for carrying the conveying members and, at need, for securing treatment devices. Each module system comprises insertion elements that are preferably arranged in pairs and are fitted on either side of the conveying path in the respective ones of the recesses provided in the carrier elements. The insertion elements of each pair serve to carry or secure one conveying member or one group of conveying members or one treatment device or one group of treatment devices respectively at at least one of their respective two ends. The module system is thereby configured in such a manner that it may be fittingly inserted, more specifically slided and most preferably snap-fitted, into the recesses of the carrier elements. Where the construction with respect to carrying the conveying members and/or securing the treatment devices is appropriate, a module system may, in the simplest case, comprise but one such insertion element that carries the conveying members and/or the treatment devices on one side only.

The treatment unit of the invention is readily manufacturable at a low cost. It may be preferably used in conveyorized lines, preferably in horizontal lines. The structure of the invention permits to readily and quickly install the treatment units. The treatment units are moreover very flexible and permit to readily utilize different transport systems without major expense and without having the carrier elements to be readapted each time. In terms of construction technique, the insertion elements in the carrier elements hereby perform the previous function of the carrier elements in that they for example carry the conveying members preferably at their two ends. In terms of configuration, such as bores, slots, long holes and so on, the carrier elements and the insertion elements are manufacturable in variable ways at a low cost, according to need on a large scale. Thanks to the uniform configuration of the conveying and treatment modules along the conveying path, it is also possible to associate auxiliary treatment devices; such as filters, submergible pumps, dosing units, heaters and coolers, in a configuration of the same type with the modules so that these elements also may be provided on always the same mounting place, with the same securing elements and with the same connecting piping and wiring, which brings further cost saving.

The assembly according to the present invention moreover also reduces the cost for maintenance, cleaning and remodeling. Thus, a module system with a certain arrangement of the conveying members, for example a certain number or positions of the conveying members, may be readily replaced by a similar or another module system and the line may immediately be operated further. This permits to considerably reduce the downtimes. The dismounted module system may then be cleaned or remodeled for example before being used again.

The module-type structure of the treatment tank is brought about by providing a treatment unit in which all the inner carrier elements, for example the carrier walls or carrier arms, comprise the same constructional features and may thus be manufactured according to always the same drawings. Preferably, all the recesses in the carrier elements comprise the same dimensions and shapes, or a few groups of differently configured recesses into which the corresponding module systems may be fitted are provided in the carrier elements. The module systems are carried in these recesses and can, for each purpose of utilization, for example for transporting thin foils, be used for several applications, such as etching or drying. This makes it possible to achieve a great variety of combinations with but a few different module systems. Particularly efficient hereby is to arrange the recesses in the carrier elements according to a uniform pattern and to provide the conveying members as well as further devices serving for treatment, such as spray nozzles or driving elements, with certain predetermined diameters (e.g., 25, 37.5 and 50 mm).

Preferably, the registration fit of the module systems in the recesses of the carrier elements can be achieved by providing each insertion element with a guide that is configured in such a manner that it registers with and engages the conformingly shaped recesses of the carrier elements. The guide means may for example be formed in a groove and tongue or in a dovetail configuration with a corresponding mating part.

If particularly large forces are to be absorbed during treatment, the module system may additionally be secured to the carrier elements by means of suited securing elements, such as screws, eccentric clamps, rocker levers or the like. The retaining force of the guide means is however often sufficient to securely carrying the module systems.

The insertion elements may be configured so that they serve to carry conveying members that are carried on either side of the conveying path and that are arranged across thereto, i.e., extend in a transverse or substantially transverse direction relative to the conveying path. Thus, in a horizontal conveyorized line in which the conveying path on which the workpieces are transported extends in a substantially horizontal plane, the conveying members may for example be arranged beneath and, at need, also above said horizontal plane.

The conveying members used may for example be configured as conveyor rolls and/or as conveyor wheels, conveyor balls and/or as spiral-shaped conveying members, the conveyor wheels or conveyor balls being mounted on axles. For example, those conveyor wheels or conveyor balls, which have different axles, may be offset relative to each other and the axles may be arranged so close together that the conveyor wheels or balls overlap when viewed in the direction of the axle. This makes it possible to also securely guide thin foils, because the thin foils will in this arrangement not be subject to wrapping around the conveying members.

Additionally, the module systems are also capable of receiving treatment devices for the wet-chemical or electrolytic treatment, these devices being held in the insertion elements. This further increases the efficiency of the treatment unit structure in accordance with the invention since these treatment devices may then also be readily mounted and dismounted in a manner according to the invention and are not unflexibly fitted. It is for example possible to remove from the carrier elements, such as for cleaning, a whole module system with several rolls or wheels and the treatment devices. Depending on the application, the treatment devices may for example be flow nozzles, jet nozzles, spray nozzles, fan nozzles, ultrasonic transducers or insoluble anodes.

The treatment devices, such as flow nozzles, spray nozzles or jet nozzles, ultrasonic transducers, fan nozzles for drying, insoluble anodes and the like, which are held in the insertion elements, may be equipped with a plug-type connection for easy dismounting, said connection being intended to supply the treatment devices with treatment fluids, such as air, or with cleaning or processing liquid and with power. No special tools are needed for remounting the module systems after cleaning. Such type module systems, which are snappable into the recesses of the carrier elements, not only facilitate maintenance but also reduce the expense involved when initially assembling the line.

Further, in the cases in which the conveying members are carried on either side of the conveying path, the insertion elements may comprise bores and/or slots and/or long holes extending substantially normal to the direction of the conveying path in order to provide, in the manner described herein above and in accordance with the thickness of the workpiece, a flexible gap for said workpiece between the conveying members. If the conveying path substantially extends in the vertical plane, auxiliary means, such as springs, may be provided on the insertion elements, said means pressing the conveying members carried in the slots against the workpieces in the direction thereof without damaging them.

The treatment unit may further comprise a drive shaft for driving the conveying members, said drive shaft being oriented parallel to at least one of the carrier elements outside of the conveying path. Thus, the drive shaft is arranged preferably normal to the parallely oriented conveying members.

From the drive shaft, the force may be transmitted either directly or indirectly to the conveying members, preferably by means of suited toothed wheels, such as deflector wheels or spur gears. For this purpose, the axles of the conveying members may protrude from that side of at least one of the insertion elements that is turned away from the conveying path and may be equipped with toothed wheels. The axles of the conveying members protruding from the one side of the insertion elements may for example comprise at least one deflector wheel or at least one spur gear or a combination comprising deflector wheels and spur gears.

The deflector wheels serve to directly transmit the force from the drive shaft onto the conveying member while changing the direction of rotation. Bevel gears, worm-gears and helical gears may be used for this purpose. The deflector wheels of the conveying members thereby engage mating deflector wheels located on the drive shaft. The deflector wheels on the conveying members and those on the drive shaft are torsionally secured together. For transmitting the force, two bevel gears or a gear and a worm may for example be used.

The force may also be transmitted indirectly to a conveying member by means of the spur gears mounted to the conveying members, for example by means of spur gears or helical gears. This may be necessary if, for technical reasons, the distance between the axles of two conveying members is chosen to be so small that the space is not sufficient to allow every deflector wheel on a conveying member to mesh with a deflector wheel on the drive shaft. In this case, the force which is directly transmitted by means of the deflector wheel from the drive shaft to a first conveying member can be transmitted further to a spur gear provided on a second conveying member through the spur gear additionally seated on said first conveying member. For this purpose, the insertion element may comprise one or several translating spur gears that transmit the force from one conveying member to another, the direction of rotation of the conveying members located on one of the two sides of the conveying path being not intended to change once the force has been transmitted through the at least one translating spur gear. Thus, with the assistance of the translating spur gears, the drive force can be transmitted between the conveying members over greater or smaller distances depending on the diameter of the conveying members. If, to span greater distances between the conveying members, several translating spur gears are to be mounted, the number of translating spur gears is to be selected such that the direction of rotation of all of the conveying members is the same with regard to their position beneath or above the conveying path. Accordingly, if the force is transmitted from one conveying member to another on the same side of the conveying path, 2n+1 translating spur gears are needed between the corresponding spur gears provided on the conveying members, with n=0, 1, 2, 3 . . . .

Likewise, the force can be indirectly transmitted from a conveying member located beneath the conveying path to a conveying member located above the conveying path for example. In this case, translating spur gears may be eliminated if the spur gears of the axles of the conveying members are caused to mesh directly. In this case, the direction of rotation of the conveying members is desirably reversed.

If mutually overlapping conveying members are needed for very thin workpieces exhibiting poor resistance to deformation in order to securely guide them so that the spacing between the axles of the conveying members needs to be adjusted so as to be very small, the spur gears may comprise, in addition to their gear rim, a collar the diameter of which is smaller than that of the gear rim. The collar with its smaller diameter serves to produce a spacing for forming a gap either between the wall of the insertion element and the gear rim of the spur gear or between the gear rim of the spur gear and a deflector wheel possibly located on the axles. A closely spaced spur gear of a neighboring conveying member can engage the respective gap. Advantageously, one and the same spur gear with collar can be used for both cases. Depending on where on the axle protruding from the carrier element said gap is needed, it may be formed by simply turning the spur gear with collar. This prevents the gear rims of the spur gears of conveying members arranged directly side by side from touching or even from blocking each other. If the force is to be transmitted indirectly between these two neighboring conveying members, a translating spur gear having a wider gear rim may be used for example so that the spur gears with collar respectively seated on the axles of the conveying members are meshed via said translating spur gear.

The embodiment of the spur gear with collar also permits to equip the module systems with particularly closely arranged conveying members that are disposed directly beneath and above the conveying path. If for example no force is to be transmitted from a conveying member located beneath the conveying path to a conveying member located above said conveying path, the gap, which is formed by offsetting the spur gears with collar, prevents the spur gears with collar respectively seated on the axles of the conveying members from meshing with one another.

As a matter of course, each treatment unit may comprise one or several module systems that are equipped in the same or in different ways and can be inserted into the carrier elements according to the purpose of application. Module systems that are only equipped with conveyor members may for example, independently from each other, alternate with other module systems which for example comprise additional treatment devices. The module systems are thereby exchangeable at will and reusable.

Beside the already mentioned uniform constructions for carrying and securing the conveying members and the treatment devices respectively, a further advantage of the invention is that the parts of the drive may also be configured to have uniform characteristics. It is for example possible to use for the drive axis but one type of deflector wheels that may be thereby arranged in a determined spaced-apart relationship according to the pattern of the carrier elements. Using translating spur gears suitably arranged on the insertion elements, a multiple direct transmission of force on each insertion element from the drive shaft to the conveying members may possibly be dispensed with, complicated respective adjustments of individual deflector wheels on the drive shaft being no longer necessary as a result thereof. A great number of like parts may thus be produced and the parts may for example be formed at low cost from injection-molded thermoplastic.

The invention will be understood better upon reading the detailed description of the examples illustrated in the Figs. wherein.

The same numerals will be used to identify identical objects throughout the Figs.

Figure 1:
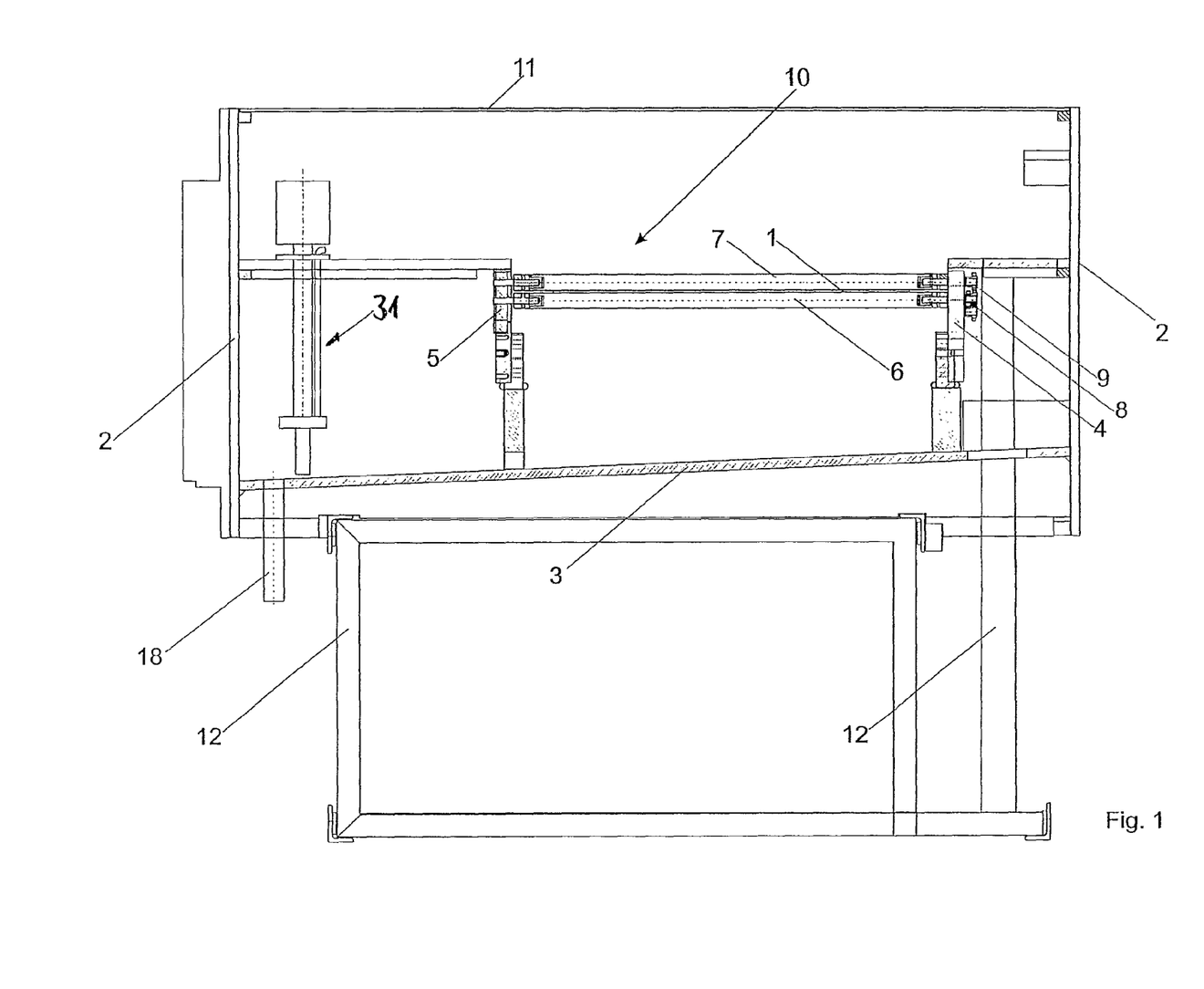
FIG. 1 is a cross-sectional view of a horizontal conveyorized line.

FIG. 1 is a cross-sectional view of a horizontal conveyorized line as viewed in the direction of transport. Flat workpieces, such as printed circuit boards and printed circuit foils, are often wet-chemically or electrolytically treated in such type horizontal lines because they are thus easier to load and unload. The line hereby includes a treatment unit (a treatment tank), said tank consisting of lateral walls 2, a cover 11 and a bottom 3 as well as of end walls that are not illustrated herein and through which the workpieces are caused to enter and exit the tank. In the treatment tank, the workpieces 1 are continuously transported on a conveying path through the line in the horizontal position between lower and upper conveying members 6, 7. For secure positioning, the tank is placed onto a supporting frame 12 preferably consisting of square tubes. This base frame may accommodate pipelines, pumps, filters, collecting tanks for processing liquid or for replenishing solutions as well as other auxiliary units.

A treatment zone 10 in which the workpieces are transported and possibly treated is formed around the workpieces. In the illustration, the workpiece 1 is moved into the plane of the drawing on the conveying path lying within the treatment zone 10. Carrier walls 4, 5 which extend into the plane of the drawing parallel to the conveying path and which carry the insertion elements for carrying the conveying members not shown herein are further shown. The conveying members are driven by a drive motor not illustrated herein and by a drive shaft that is not illustrated herein either and that extends parallel to the carrier walls, said drive shaft being suitably equipped with deflector wheels. For this purpose, the drive shaft comprises deflector wheels that are configured to be bevel gears and that transmit the force to bevel gears which are torsionally secured on the axles of the conveying members (not illustrated herein, see FIG. 5). Spur gears 9 are located on the axles of the conveying members 6, 7. Translating spur gears 8 are also shown, said translating spur gears being carried on the insertion elements which, in turn, are plugged in the carrier elements 4.

The tank bottom 3, which is located beneath the conveying path, is configured to slope downward toward the left and is in liquid-tight connection with the side walls 2. The processing liquid used in the treatment zone 10 collects in the lowest part of the bottom 3 and is pumped away via a submergible pump 31 or drained via a drain connector 18 prior to being recirculated to the treatment zone 10 by means of pumps that are not illustrated herein. For refreshing the processing liquid, further devices that are not illustrated herein, such as heaters, coolers, dosing units, filters and the like, may further be mounted on the bottom 3 of the tank for example.

Figure 2:
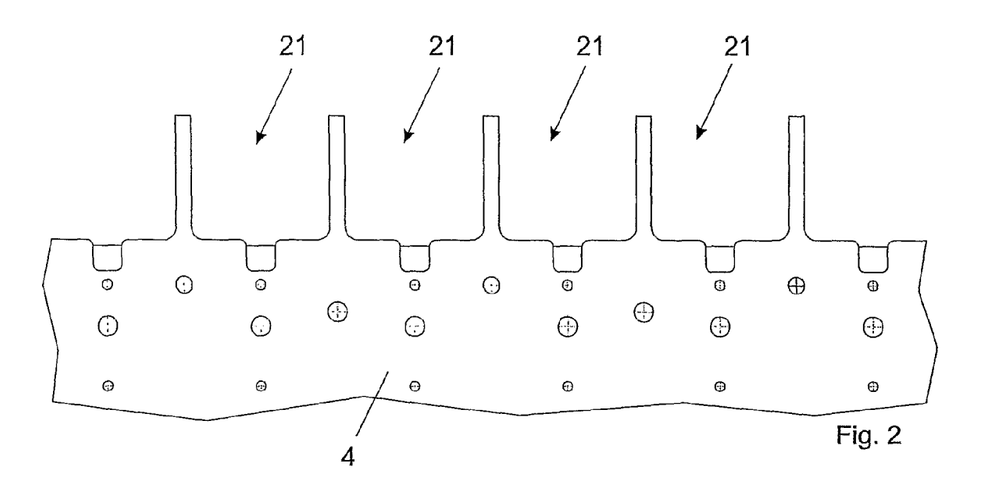
FIG. 2 is a side view of a portion of a carrier wall with the recesses for the insertion elements.

FIG. 2 is a side view of a part of a carrier wall 4 in accordance with the invention, said carrier wall comprising a uniform configuration along the entire length of a treatment unit. The recesses 21 are thereby regularly disposed and formed in the same manner. The insertion elements as they are illustrated in the FIGS. 3, 4, 8, 9 and 10 for example can be inserted into said recesses from the top.

Figure 3:
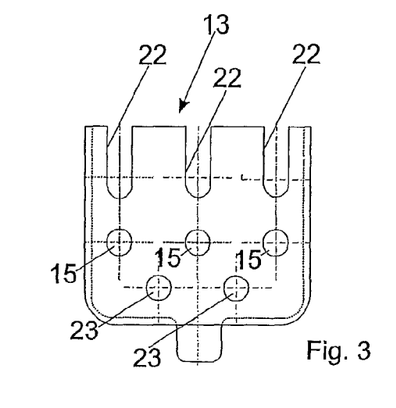
FIG. 3 shows an insertion element as viewed in the direction of the longitudinal axis of the conveying members.

FIG. 3 shows a preferred insertion element 13 as viewed in the direction of the longitudinal axis of the conveying members. In its upper part, the insertion element 13 comprises recesses corresponding to the shape of a slot that are employed as bearing guides 22 in which the upper conveying members (not shown) can be carried. The bearings 15 for the lower conveying members (not shown) are aligned normal to the slots. In the center between the lower conveying member bearings 15 there are located the bearings 23 for translating spur gears (not shown).

Figure 4:
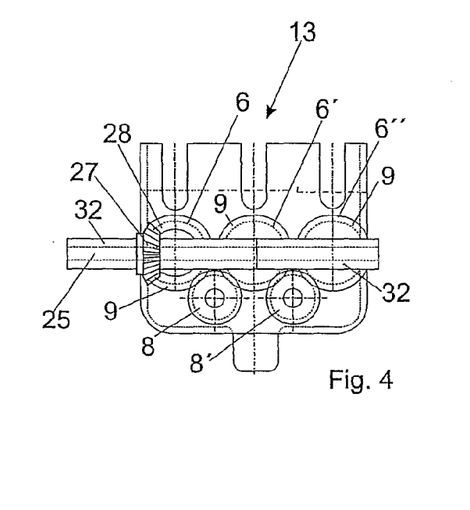
FIG. 4 shows the insertion element according to FIG. 3 with conveying members.

FIG. 4 shows the insertion element 13 according to FIG. 3 in which the translating spur gears 8, 8' and lower conveying members 6, 6', 6" are schematically shown with the axles being equipped in different ways with spur gears 9 or with a deflector wheel 28, respectively. The axle of the left conveying member 6 comprises a spur gear 9 and a deflector wheel 28 whereas the axles of the central and right conveying members 6', 6" only comprise but one spur gear 9 each. Further, the deflector wheel 27 of the drive shaft 25 is outlined.

The left conveying member 6 is driven directly via the deflector wheel 28 by means of a deflector wheel 27 on the drive shaft 25 (a detail of which only is shown). All of the other conveying members 6', 6" provided on the module 13 are indirectly caused to rotate by said one conveying member 6. For this purpose, the translating spur gears 8, 8' are placed and configured in such a manner that the force is first transmitted from the left conveying member 6 via the spur gear 9 to the central conveying member 6'. The force from the left conveying member 6 is transmitted from the first translating spur gear 8 to the spur gear 9 of the central conveying member 6' and from there through the second translating spur gear 8' to the spur gear 9 of the right conveying member 6".

Where necessary, upper conveying members (not shown) are driven through spur gears 9 located on their axles, said spur gears meshing with the spur gears 9 of the lower conveying members 6, 6', 6". In this case, the direction of rotation of the upper conveying members is desirably reversed in the opposite direction.

Only one deflector wheel 27 is needed for the module of FIG. 4. A deflector wheel 27 is fixed onto the drive shaft 25 made from square material wherever a drive is needed. Where no deflector wheel is needed, a spacer sleeve 32 is provided on the shaft instead. The spaces between the deflector wheels 27 on the drive shaft are preferably regular so that again only a few different component parts are needed. In this case, the translating spur gears 8, 8' are used in addition to the spur gears 9 for driving the central and right conveying members 6', 6". This permits to flexibly design the force transmission to the conveying members for different embodiments of the insertion elements.

Figure 5:
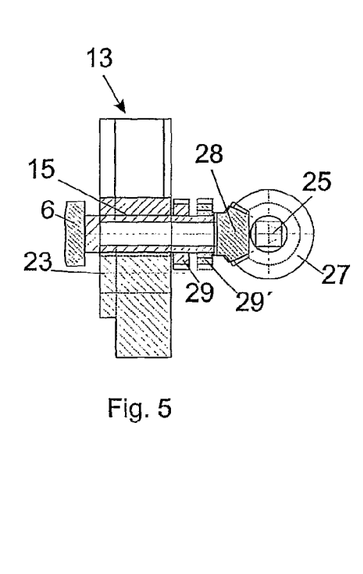
FIG. 5 is a front view of a detail of the insertion element of FIG. 3.

FIG. 5 is a front view showing a detail of the insertion element of FIG. 3. It further shows a drive shaft 25, a deflector wheel 27 configured as a bevel gear, a conveying member 6 that is carried in the insertion element 13, the axle protruding from the insertion element being equipped with a spur gear with collar 29 and with a deflector wheel configured to be a bevel gear 28, the collar forming a gap between the gear rim of the bevel gear 28 and that of the spur gear with collar 29. The force for the movement of rotation is transmitted by means of shaft 25 via the bevel gear 27 (mating part of bevel gear 28) to the bevel gear 28 on the conveying member. Behind the spur gear with collar 29 lies, partially concealed in FIG. 5, another spur gear with collar 29' that is seated on a neighboring conveying member (not shown) so as to be flush, the collar forming a gap between the gear rim and the wall of the insertion element. This arrangement permits the neighboring conveying members to be closely spaced together without the gear rims of the spur gears 29, 29' meshing with one another.

From this view it can be seen that the bevel gears 27, 28 need quite a lot of space to transmit the force from the drive shaft to the conveying members. This is the reason why no bevel gear is provided for on the neighboring conveying member 6'. The neighboring conveying member is intended to be driven through a translating spur gear that is not illustrated herein.

Figures 6, 7:
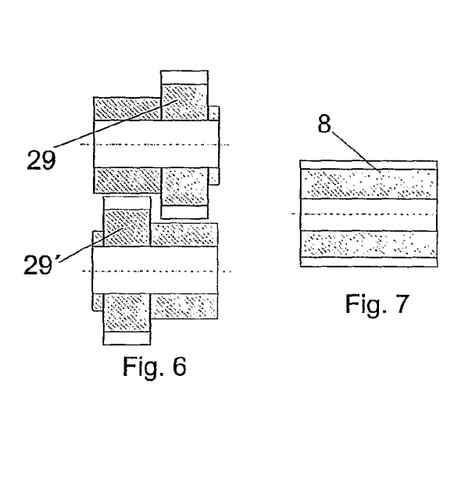
FIG. 6 is a cross-sectional view of two alternately disposed spur gears with additional collar.
FIG. 7 is a cross-sectional view of a translating spur gear with a double wide gear rim.

FIG. 6 illustrates a cross-sectional view of two spur gears with additional collars 29, 29' that are arranged so as to display mirror-image symmetry. In principle, this arrangement corresponds to the arrangement of the spur gears with collar 29, 29' of FIG. 5. In FIG. 6 it can be seen that, with the respective gear rims being offset by the collar, the distance between the axles of the spur gears may be reduced as compared to the distance separating gear rims that are not offset. This permits to arrange the conveying members in a closer relationship. It may also be recognized that the spur gears with collar 29, 29' are built according to the same principle, which aids in reducing the production costs. The effect desired is achieved by placing the spur gears with collar 29, 29' in an inverted position on the axles of the conveying members.

FIG. 7 shows a cross-sectional view of a translating spur gear with a double wide gear rim. It is for example used to transmit the drive force from one conveying member to a neighboring conveying member located on the same side of the conveying path, spur gears with collar 29, 29' being utilized on the conveying members 6, as illustrated in FIG. 5 for example.

Figure 8:
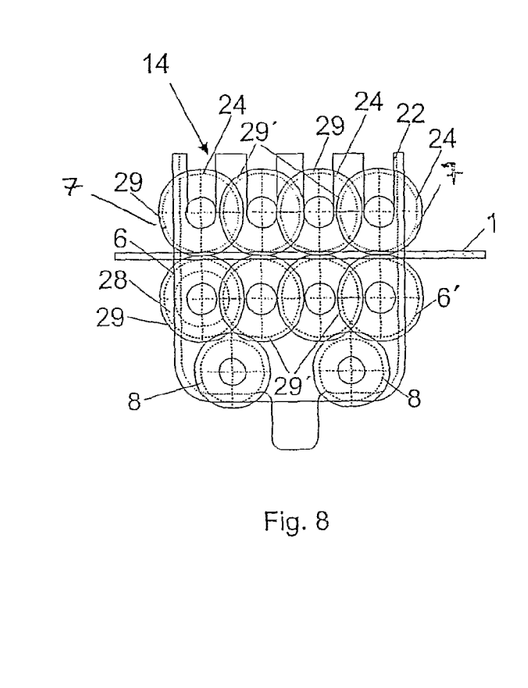
FIG. 8 is the same view as FIG. 3 now showing an alternative embodiment of an insertion element with overlapping conveying members.

FIG. 8 shows an alternative embodiment of an insertion element 14 in the same view as FIG. 3 with overlapping conveyor wheels 24 (shown in a dashed line) of the conveying members 6, 6' located beneath and of the conveying members 7 seated in bearing guides 22 and located above the workpieces 1. Translating spur gears 8 with a double wide gear rim, deflector gears 27, 28 (28 only being illustrated herein for the sake of clarity) and spur gears with collar 29, 29' are additionally used.

If, as shown in FIG. 5, the conveying members 6, 6', 7 for transporting foil-type workpieces 1 are to be arranged so as to overlap in order to prevent foils possibly sticking to the conveyor wheels 24 from being deviated downward or upward out of the conveying path, the space available is no longer sufficient to directly drive all of the conveying members 6, 6'. Then, the force may only be transmitted through the conveying member 6 on place one and three, or alternatively, on place two and four. For this purpose, a combination of spur gear with collar 29 and deflector wheel 28 (as described in FIG. 5) is provided on the respective one of the lower conveying members 6 on place one and three or on place two and four. The remaining conveying members 6' respectively only comprise a spur gear with collar 29'. To prevent the spur gears on the conveying members from blocking one another when they are closely spaced together, the position of the spur gears with collar 29, 29' thereby corresponds to the arrangement in FIG. 6. The force is transmitted from the conveying member 6 on place one to the conveying member 6' on place two by the translating spur gear 8 with wide gear rim (according to FIG. 7) meshing with the spur gears with collar 29, 29'. Accordingly, a uniform intermediate spur gear 8 may be used in this preferred embodiment.

The upper conveying members 7 are driven by meshing with the spur gear with collar 29, 29' arranged on the axles of the conveying members 6, 6'. Meaning, pairs of conveying members 6, 7 or 6', 7, respectively, comprise one pair of spur gears having the same collar arrangement, i.e., 29 and 29 or 29' and 29', respectively.

FIG. 8 accordingly shows a preferred completely equipped module system for transporting thin workpieces with 4 pairs of overlappingly arranged conveying members.

Figure 9:
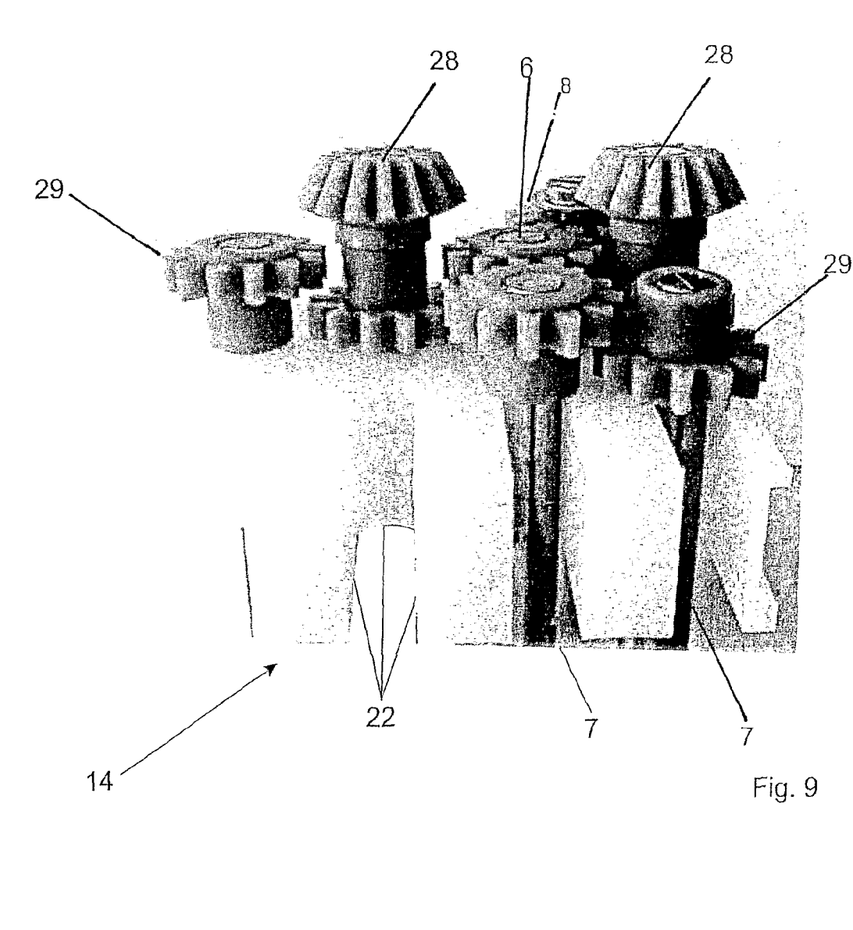
FIG. 9 is a perspective photographic illustration of an insertion element with axles of the conveying members and different toothed wheels according to FIG. 8.

FIG. 9 shows a perspective photographic illustration of an insertion element with axles of the conveying members and different toothed wheels in accordance with the embodiment in FIG. 8.

Two upper conveying members with their equipment have been removed for increased clarity. One translating spur gear 8 has also been omitted. Only the axles of the conveying members are shown, not the conveying members themselves. With regard to the different elements, the reader is referred to the illustration of FIG. 8.

Figure 10:
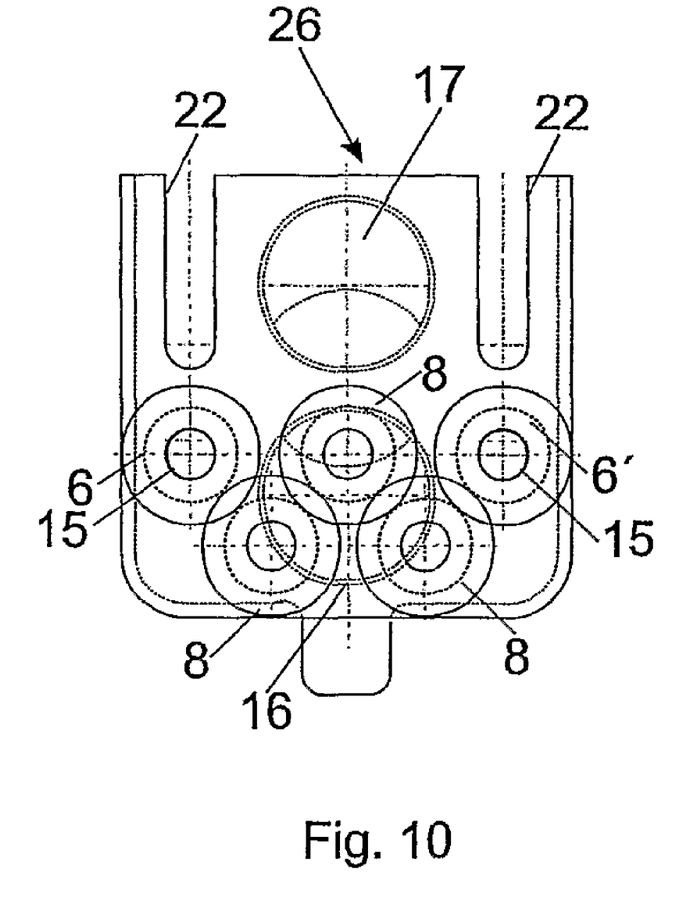
FIG. 10 is the same view as FIG. 3 now showing another insertion element that additionally comprises a treatment device.

FIG. 10 illustrates an insertion element 26 in the same view as FIG. 3. This element additionally carries treatment devices. If the module system is provided for chemical treatment, the right conveying member 6' is in principle driven indirectly in a manner analogous to that shown in FIG. 4.

In FIG. 10 liquid supply pipes 16 and 17 are provided for treating the upper and lower surfaces of the workpieces. Accordingly, there is no conveying member in the center of the insertion element 26. While only the left conveying member 6 of the insertion element 26 comprising on its axle one deflector wheel and one spur gear is driven directly, the central conveying member 6', which is equipped with one spur gear, is driven indirectly by means of three translating spur gears 8, because of a lacking spur gear at this central conveying member. It is thus possible to realize this variant with the same geometry than in the case of the insertion element 13 in FIG. 4.

Figure 11:
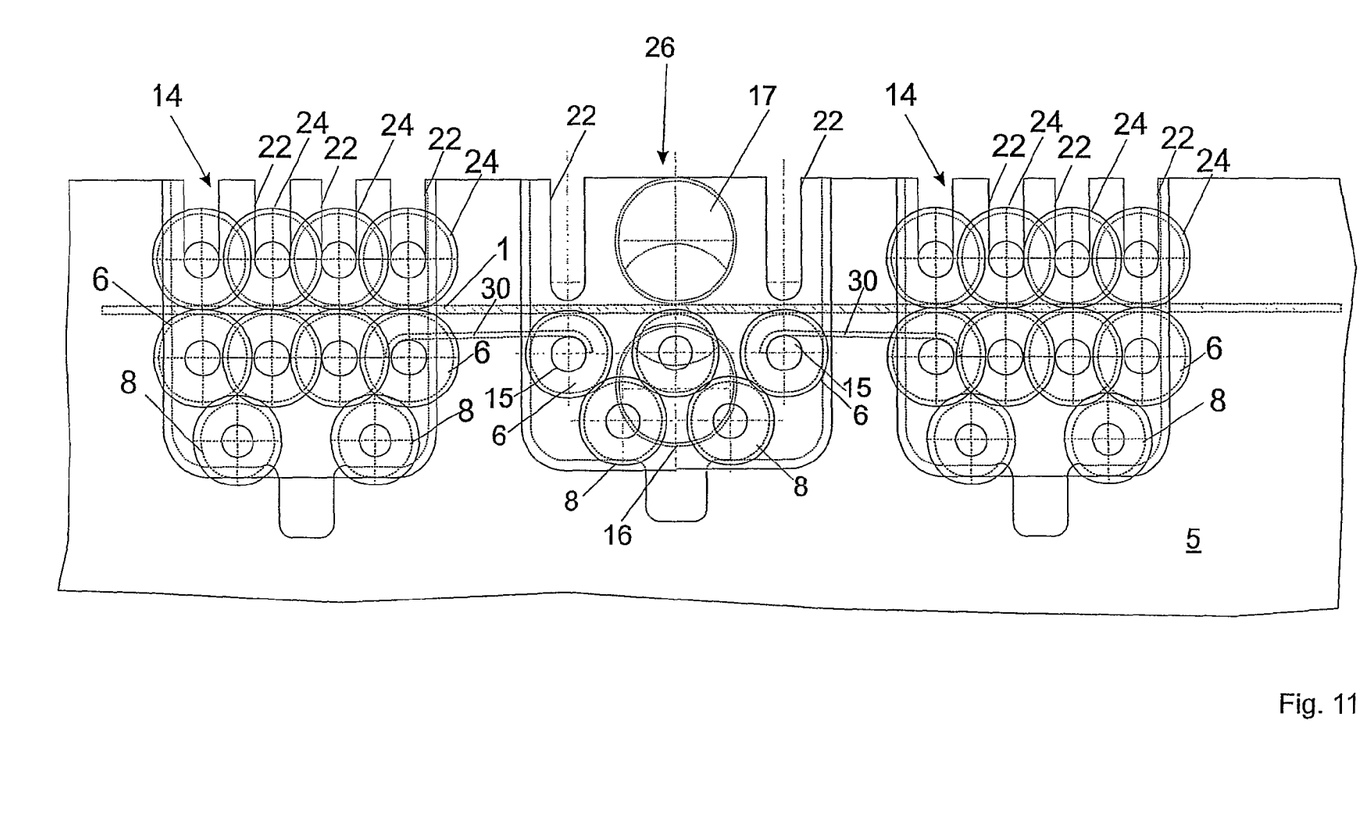
FIG. 11 shows a detail of the carrier wall of a treatment station with workpieces and differently configured insertion elements in accordance with FIG. 8 and FIG. 10.

FIG. 11 shows a detail of the carrier wall 5 of a treatment station with a workpiece 1 and with differently configured insertion elements 14, 26 according to FIG. 8 and FIG. 10.

The detail view shows a chemical treatment unit for treating the workpieces 1 by means of treatment nozzles 16, 17 which are arranged in the central insertion element 26. For guiding the workpieces 1 as they are being fed and removed, the left and right insertion elements 14 are arranged in front and behind the insertion element 26 as viewed in the direction of transport. In the case of very thin workpieces, it may be necessary to provide additional guide elements 30 between the modules in order to prevent the workpieces from being driven out of the path by the jet of liquid as they enter the treatment station.

It is however also possible to combine at will the insertion elements and different embodiments of individual insertion elements in accordance with the purpose of utilization in other ways as well.

It is understood that the examples, drawings and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

LISTING OF NUMERALS

1 workpieces
2 side walls of the tank
3 bottom of the tank 4 carrier wall
5 carrier wall
6, 6', 6" lower conveying members
7 upper conveying members
8, 8' translating spur gear
9 spur gear
10 treatment zone
11 cover of the tank
12 base frame
13 insertion element
14 insertion element
15 bearing for conveying members
16 treatment element (treatment nozzle) bottom
17 treatment element (treatment nozzle) top
18 drain connector
21 recess for insertion elements
22 bearing guides
23 bearing for translating spur gear
24 overlapping conveyor wheels
25 drive shaft
26 insertion element with nozzle array
27, 27' deflector wheel (bevel gear)
28 deflector wheel (mating part of bevel gear)
29, 29' spur gear with collar
30 guide elements
31 submergible pump
32 spacer sleeve

The invention claimed is:

1. A treatment unit for the wet-chemical or electrolytic treatment of flat workpieces, comprising conveying members for transporting the workpieces in the unit on a conveying path, and treatment devices for the workpieces characterized in that the treatment unit further comprises
   a) carrier elements (4, 5) with recesses (21), said carrier elements being oriented to be parallel to the conveying path and wherein all the recesses (21) have the same dimensions and shapes, or wherein a few differently configured groups of recesses are provided in the carrier elements (4, 5), all recesses (21) of one group of recesses (21) having the same dimensions and shapes, and
   b) at least one module system, each one serving for carrying or securing at least one treatment device, said module system comprising insertion elements (26), said insertion elements (26) being configured such that they are fitted into the recesses (21) of the carrier elements (4, 5),
characterized in that at least one of the insertion elements (26) carry or secure either at least one treatment device or an ensemble of at least one conveying member and at least one treatment device (16, 17);
   c) characterized in that said at least one treatment device (16, 17) is any of:
      i flow nozzles;
      ii jet nozzles;
      iii fan nozzles;
      iv ultrasonic transducers; and/or
      v insoluble anodes.

2. A treatment unit for the wet-chemical or electrolytic treatment of flat workpieces, comprising conveying members for transporting the workpieces in the unit on a conveying path, and treatment devices for the workpieces characterized in that the treatment unit further comprises
   a) carrier elements (4, 5) with recesses (21), said carrier elements being oriented to be parallel to the conveying path and wherein all the recesses (21) have the same dimensions and shapes, or wherein a few differently configured groups of recesses are provided in the carrier elements (4, 5), all recesses (21) of one group of recesses (21) having the same dimensions and shapes, and
   b) at least one module system, each one serving for carrying or securing at least one treatment device, said module system comprising insertion elements (26), said insertion elements (26) being configured such that they are fitted into the recesses (21) of the carrier elements (4, 5),
characterized in that at least one of the insertion elements (26) carry or secure at least one treatment device, (16, 17);
   c) characterized in that said at least one treatment device (16, 17) is any of:
      i flow nozzles;
      ii jet nozzles;
      iii fan nozzles;
      iv ultrasonic transducers; and/or
      v insoluble anodes.

3. The treatment unit according to any one of claims 1 and 2, characterized in that the conveying members are carried on both sides of the conveying path, with said conveying members extending in a transverse or substantially transverse direction relative to the conveying path.

4. The treatment unit according to any one of claims 1 and 2 characterized in that the conveying members are conveyor rolls and/or conveyor wheels or conveyor balls and/or spiral-shaped conveying members, the conveyor wheels or conveyor balls being mounted on axles.

5. The treatment unit according to claim 4, characterized in that those conveyor wheels or conveyor balls have different axles and are offset relative to each other and in that the axles are arranged so close together that the conveyor wheels or conveyor balls overlap as viewed in the direction of the axle.

6. The treatment unit according to any one of claims 1 and 2 characterized in that the conveying path extends in a substantially horizontal plane.

7. The treatment unit according to any one of claims 1 and 2, characterized in that the insertion elements (26) comprise connectors for supplying the treatment devices (16, 17) with treatment media or with power.

8. The treatment unit according to any one of claims 1 and 2 characterized in that the insertion elements (26) comprise bores (15) and/or slots (22) and/or long holes for carrying the conveying members said slots and long holes extending substantially normal to the conveying path.

9. The treatment unit according to any one of claims 1 and 2 characterized in that it further comprises a drive shaft (25) that is oriented to be parallel to at least one of the carrier elements (4, 5) outside of the conveying path and that drives the conveying members.

10. The treatment unit according to claim 9, characterized in that the drive shaft (25) comprises deflector wheels (28) corresponding to and engaging the deflector wheels (27, 27') of the conveying members.

11. The treatment unit according to any one of claims 1 and 2 characterized in that the axles of the conveying members (6, 6', 6", 7) protrude from that side of at least one of the insertion elements (26) that is turned away from the conveying path and that the axles are equipped with toothed wheels for transmitting the force to the conveying members.

12. The treatment unit according to claim 11, characterized in that the toothed wheels are at least one of deflector wheels (27, 27') and spur gears (9, 29, 29').

13. The treatment unit according to claim 12, characterized in that the axles of the conveying members comprise either a deflector wheel (27, 27') or a spur gear (9, 29, 29') or a combination consisting of deflector wheel (27, 27') and spur gear (9, 29, 29').

14. The treatment unit according to claim 12, characterized in that the deflector wheels (27, 27', 28) are any of bevel gears, worm-gears and helical gears.

15. The treatment unit according to claim 12, characterized in that the spur gears (9, 29, 29') on the conveying members and the translating spur gears (8, 8') are arranged relative to each other and engage in such a manner that the direction of rotation of the spur gears (9, 29, 29') remains unchanged.

16. The treatment unit according to claim 12, characterized in that the spur gears (29, 29') comprise, in addition to a gear rim, a collar of a diameter smaller than the gear rim, thus making it possible to dispose the axles of the conveying members close to each other, the collar being formed either in front or behind the gear rim as viewed in the direction of the axle of the conveying members.

17. The treatment unit according to any one of claims 1 and 2 characterized in that, on that side of at least one of the insertion elements (26), that is turned away from the conveying path, the insertion elements (26) are provided with at least one translating spur gear (8, 8') for transmitting the force between two conveying members.

18. The treatment unit according to any one of claims 1 and 2 characterized in that the insertion elements are arranged in pairs.

19. The treatment unit according to any one of claims 1 and 2 characterized in that the insertion elements are fittingly slidable into the recesses (21) of the carrier elements (4, 5).

20. A method of using a treatment unit according to any one of claims 1 and 2 for treating flat workpieces in a horizontal conveyorized line.

21. A treatment unit for the treatment of flat workpieces through any one of:
  (i) wet-chemical treatment; and
  (ii) electrolytic treatment;
comprising conveying members for transporting the workpieces in the unit on a conveying path and treatment devices for the workpieces; characterized in that the treatment unit further comprises carrier elements (4, 5) with recesses (21); with said carrier elements being oriented to be parallel to the conveying path and wherein a plurality of the recesses comprise at least one group of recesses; wherein all of the recesses in each one of the at least one group of recesses have the same dimensions and shapes; and at least one module system in the treatment unit; the at least one module system comprising means for effecting any one of:
  (iii) the carrying of; and
  (iv) the securing of;
  (v) the treatment devices;
said module system comprising insertion elements (26); said insertion elements (26) being configured such that they are fitted into the recesses (21) of the carrier elements (4, 5); characterized in that at least one of the insertion elements (26) carries or secures any one of:
  (vi) at least one treatment device; and
  (vii) an ensemble of at least one conveying member and at least one treatment device (16, 17);
  (viii) characterized in that said at least one treatment device (16, 17) is any of:
    (a) (flow nozzles;
    (b) jet nozzles;
    (c) fan nozzles;
    (d) ultrasonic transducers; and/or
    (e) insoluble anodes.

22. A treatment unit for the treatment of flat workpieces through at least one of:
  (i) wet-chemical treatment; and
  (ii) electrolytic treatment;
comprising conveying members for transporting the workpieces in the unit on a conveying path and treatment devices for the workpieces; characterized in that the treatment unit further comprises carrier elements (4, 5) with recesses (21); with said carrier elements being oriented to be parallel to the conveying path and wherein a plurality of the recesses comprise at least one group of recesses; wherein all of the recesses in each one of the at least one group of recesses have the same dimensions and shapes; and at least one module system in the treatment unit; the at least one module system comprising means for effecting at least one of:
  (iii) the carrying of; and
  (iv) the securing of;
  (v) the treatment devices;
said module system comprising insertion elements (26); said insertion elements (26) being configured such that they are fitted into the recesses (21) of the carrier elements (4, 5); characterized in that at least one of the insertion elements (26) carries or secures at least one of:
  (vi) at least one treatment device;
  (vii) an ensemble of at least one conveying member and at least one treatment device (16,17);
  (viii) characterized in that said at least one treatment device (16, 17) is any of:
    (a) flow nozzles;
    (b) jet nozzles;
    (c) fan nozzles;
    (d) ultrasonic transducers; and/or
    (e) insoluble anodes.

23. The treatment unit according to any one of claims 1 and 2, characterized in that the insertion elements (26) are secured to the carrier elements by any of screws, eccentric clamps and rocker levers.

* * * * *